United States Patent
Pan

(10) Patent No.: US 7,459,969 B2
(45) Date of Patent: Dec. 2, 2008

(54) TRANSMITTER POWER AMPLIFIER WORKING AT DIFFERENT POWER SUPPLIES

(75) Inventor: Meng-An (Michael) Pan, Cerritos, CA (US)

(73) Assignee: Broadcom Corporation, Irvine, CA (US)

( * ) Notice: Subject to any disclaimer, the term of this patent is extended or adjusted under 35 U.S.C. 154(b) by 125 days.

(21) Appl. No.: 11/503,035

(22) Filed: Aug. 11, 2006

(65) Prior Publication Data

US 2008/0036532 A1 Feb. 14, 2008

(51) Int. Cl.
 *H03F 1/14* (2006.01)
(52) U.S. Cl. .......................................... 330/51; 330/253
(58) Field of Classification Search .................. None
See application file for complete search history.

(56) References Cited

U.S. PATENT DOCUMENTS 6,757,526 B1 * 6/2004 Sharp et al. ............... 455/127.1
6,888,411 B2 * 5/2005 Behzad et al. .............. 330/311
7,203,511 B2 * 4/2007 Trachewsky et al. ........ 455/522
2004/0176052 A1 * 9/2004 Vilhonen et al. ......... 455/127.1

* cited by examiner

*Primary Examiner*—Robert Pascal
*Assistant Examiner*—Alan Wong
(74) *Attorney, Agent, or Firm*—Garlick Harrison & Markison

(57) ABSTRACT

A method to reduce transmitted output power and the battery consumption is provided. This involves first determining the required output level. The amplitude of the input signal provided to a PA driver may be based on the required output power level. This amplitude may be set by a PGA. A number of cascode bias signals are also provided to the PA driver. These cascode bias signals are based on the required output power level as well. Reducing the cascode bias signals by enabling/disabling circuits within the PA driver allows power consumption of the wireless device to be reduced.

8 Claims, 14 Drawing Sheets

TRANSMITTER POWER AMPLIFIER WORKING AT DIFFERENT POWER SUPPLIES

TECHNICAL FIELD OF THE INVENTION

The present invention relates generally to techniques used within wireless communication systems, and more particularly to power consumption within a wireless communication system.

BACKGROUND OF THE INVENTION

Communication systems are known to support wireless and wire lined communications between wireless and/or wire lined communication devices. Such communication systems range from national and/or international cellular telephone systems, to the Internet, and to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

Power consumption within wireless communication devices directly impacts the performance and usefulness of these devices. In order to perform better, the wireless communication device must reduce battery level consumption. Many prior techniques reduce transmitted power but fail to reduce battery consumption. This results in increased inefficiency and no improvement in battery consumption.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE DRAWINGS

Preferred embodiments of the present invention are illustrated in the FIGs., like numerals being used to refer to like and corresponding parts of the various drawings.

Figure 1:
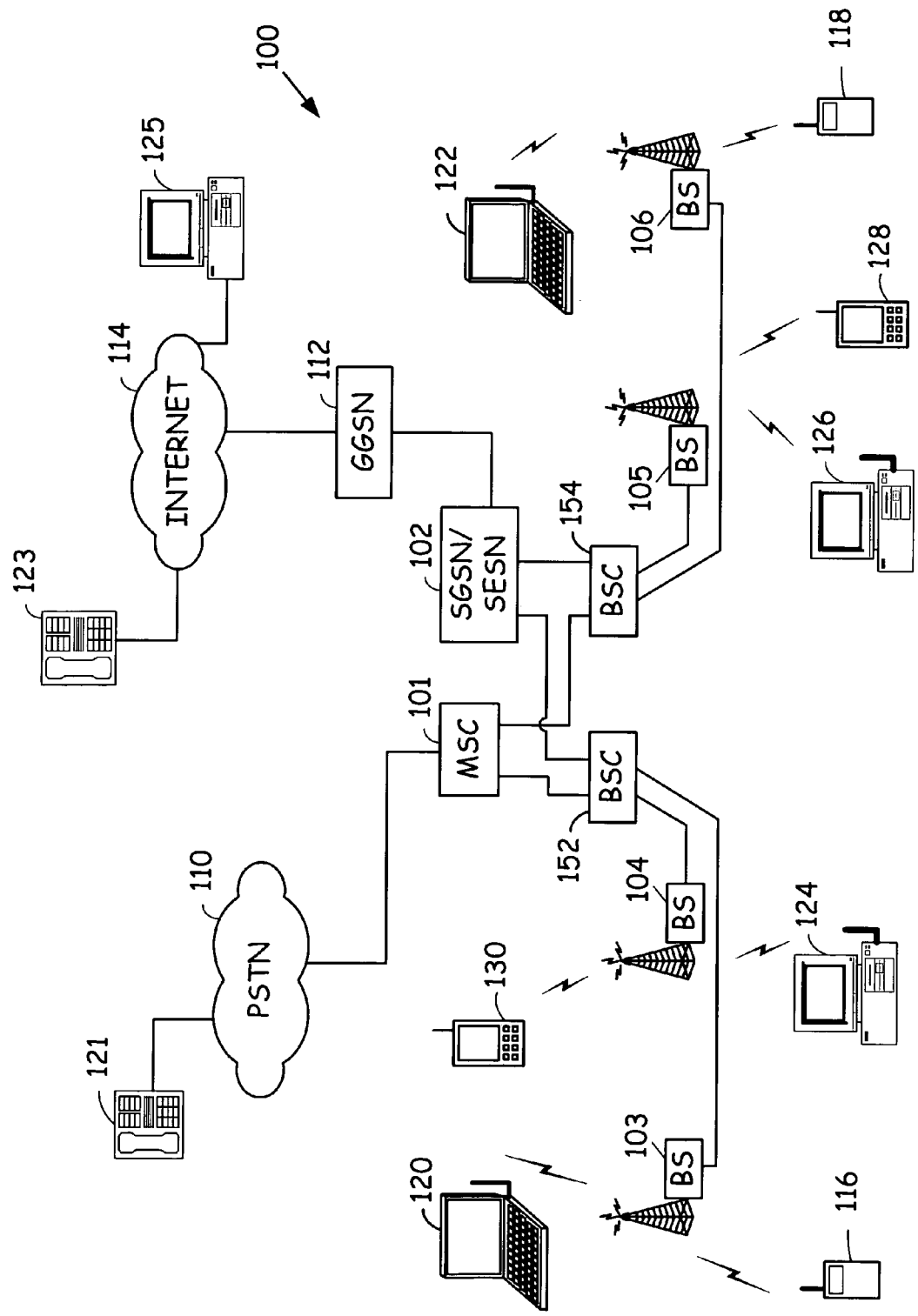
FIG. 1 is a system diagram illustrating a portion of a wireless communication system that supports wireless terminals operating according to the present invention.

FIG. 1 is a system diagram illustrating a portion of a wireless communication system 100 that supports wireless terminals operating in accordance with embodiments of the present invention. Wireless communication system 100 includes a Mobile Switching Center (MSC) 101, Serving GPRS Support Node/Serving EDGE Support Node (SGSN/SESN) 102, base station controllers (BSCs) 152 and 154, and base stations 103, 104, 105, and 106. The SGSN/SESN 102 couples to the Internet 114 via a GPRS Gateway Support Node (GGSN) 112. A conventional voice terminal 121 couples to the PSTN 110. A Voice over Internet Protocol (VoIP) terminal 123 and a personal computer 125 couple to the Internet 114. The MSC 101 couples to the Public Switched Telephone Network (PSTN) 110.

Each of the base stations 103-106 services a cell/set of sectors within which it supports wireless communications. Wireless links that include both forward link components and reverse link components support wireless communications between the base stations and their serviced wireless terminals. These wireless links can result in co-channel and adjacent channel signals that may appear as noise which may be colored or white.

These wireless links may support digital data communications, VoIP communications, and other digital multimedia communications. The wireless communication system 100 may also be backward compatible in supporting analog operations as well. The wireless communication system 100 may support the Global System for Mobile telecommunications (GSM) standard and also the Enhanced Data rates for GSM (or Global) Evolution (EDGE) extension thereof. The wireless communication system 100 may also support the GSM General Packet Radio Service (GPRS) extension to GSM. However, the present invention is also applicable to other standards as well, e.g., 802.11 a/g, TDMA standards, CDMA standards, etc. In general, the teachings of the present invention apply to digital communication techniques that address the identification and cancellation of interfering communications.

Wireless terminals 116, 118, 120, 122, 124, 126, 128, and 130 couple to the wireless communication system 100 via wireless links with the base stations 103-106. As illustrated, wireless terminals may include cellular telephones 116 and 118, laptop computers 120 and 122, desktop computers 124 and 126, and data terminals 128 and 130. However, the wireless communication system 100 supports wireless communications with other types of wireless terminals as well. As is generally known, devices such as laptop computers 120 and 122, desktop computers 124 and 126, data terminals 128 and 130, and cellular telephones 116 and 118, are enabled to "surf" the Internet 114, transmit and receive data communications such as email, transmit and receive files, and to perform other data operations. Many of these data operations have significant download data-rate requirements while the upload data-rate requirements are not as severe. Some or all of the wireless terminals 116-130 are therefore enabled to support the EDGE operating standard. These wireless terminals 116-130 also support the GSM standard and may support the GPRS standard.

Figure 2:
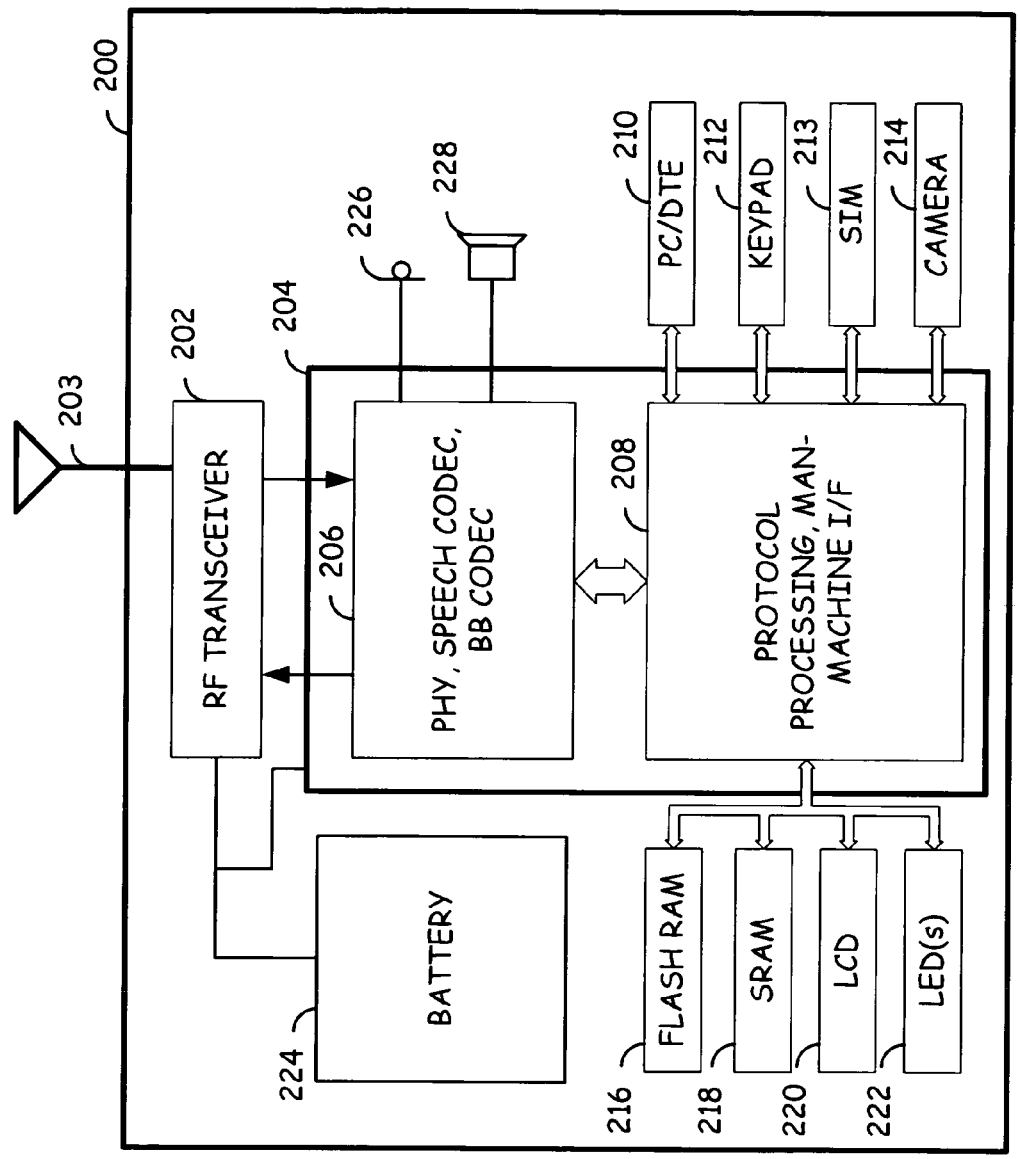
FIG. 2 is a block diagram functionally illustrating a wireless terminal constructed according to the present invention.

FIG. 2 is a block diagram functionally illustrating wireless terminal 200. The wireless terminal 200 of FIG. 2 includes an RF transceiver 202, digital processing components 204, and various other components contained within a housing. The digital processing components 204 includes two main functional components, a physical layer processing, speech COder/DECoder (CODEC), and baseband CODEC functional block 206 and a protocol processing, man-machine interface functional block 208. A Digital Signal Processor (DSP) is the major component of the physical layer processing, speech COder/DECoder (CODEC), and baseband CODEC functional block 206 while a microprocessor, e.g., Reduced Instruction Set Computing (RISC) processor, is the major component of the protocol processing, man-machine interface functional block 208. The DSP may also be referred to as a Radio Interface Processor (RIP) while the RISC processor may be referred to as a system processor. However, these naming conventions are not to be taken as limiting the functions of these components.

RF transceiver 202 couples to an antenna 203, to the digital processing components 204, and also to battery 224 that powers all components of wireless terminal 200. The physical layer processing, speech COder/DECoder (CODEC), and baseband CODEC functional block 206 couples to the protocol processing, man-machine interface functional block 208 and to a coupled microphone 226 and speaker 228. The protocol processing, man-machine interface functional block 208 couples to various components such as, but not limited to, Personal Computing/Data Terminal Equipment interface 210, keypad 212, Subscriber Identification Module (SIM) port 213, a camera 214, flash RAM 216, SRAM 218, LCD 220, and LED(s) 222. When camera 214 and LCD 220 are present, these components may support either/both still pictures and moving pictures. Thus, the wireless terminal 200 of FIG. 2 may be operable to support video services as well as audio services via the cellular network.

Figure 3:
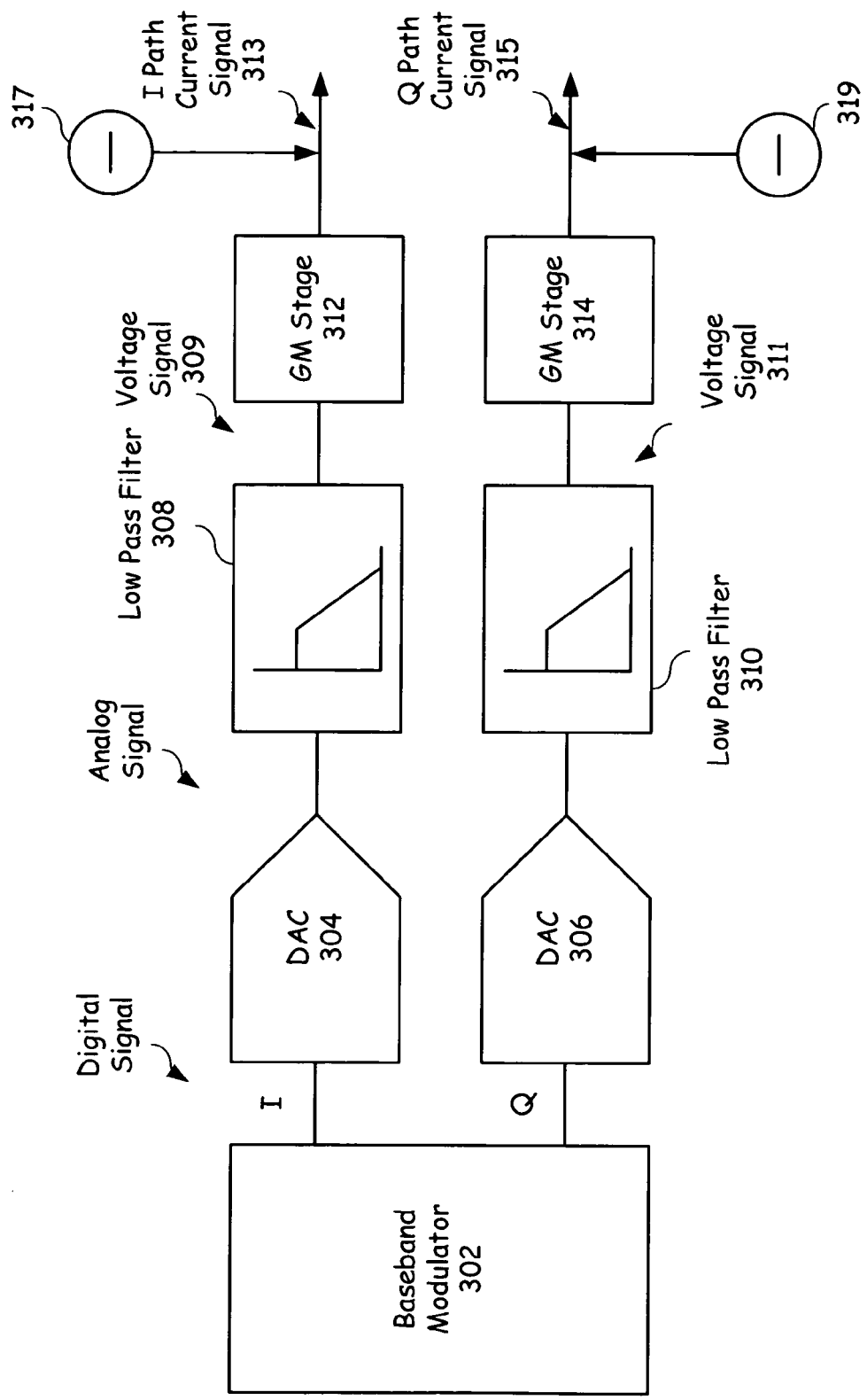
FIG. 3 depicts a transmitter architecture within an RF transceiver in accordance with embodiments of the present invention.

FIG. 3 depicts a transmitter architecture within an RF transceiver, such as RF transceiver 202, in accordance with embodiments of the present invention. This transmitter architecture includes a baseband modulator 302, and an in-phase (I) path and a quadrature (Q) path. The path includes a digital analog converter (DAC) 304, low pass filter 308, GM Stage 312, and offset current source 317. The Q path includes DAC 306, low pass filter 310, GM Stage 314, and offset current source 319. Baseband modulator 302 provides a digital I and Q signal to DAC 304 and 306 respectively. DAC 304 and 306 produced an analog signal which is operated on by low pass filters 308 in the I path and 310 of the Q path. This results in a voltage signal 309 and 311 for I and Q path respectively. This voltage signal is provided to GM Stage 312 and 314 where the GM Stages convert the voltage signal to current signals 313 and 315 which may be provided to the up conversion mixers.

Figure 4:
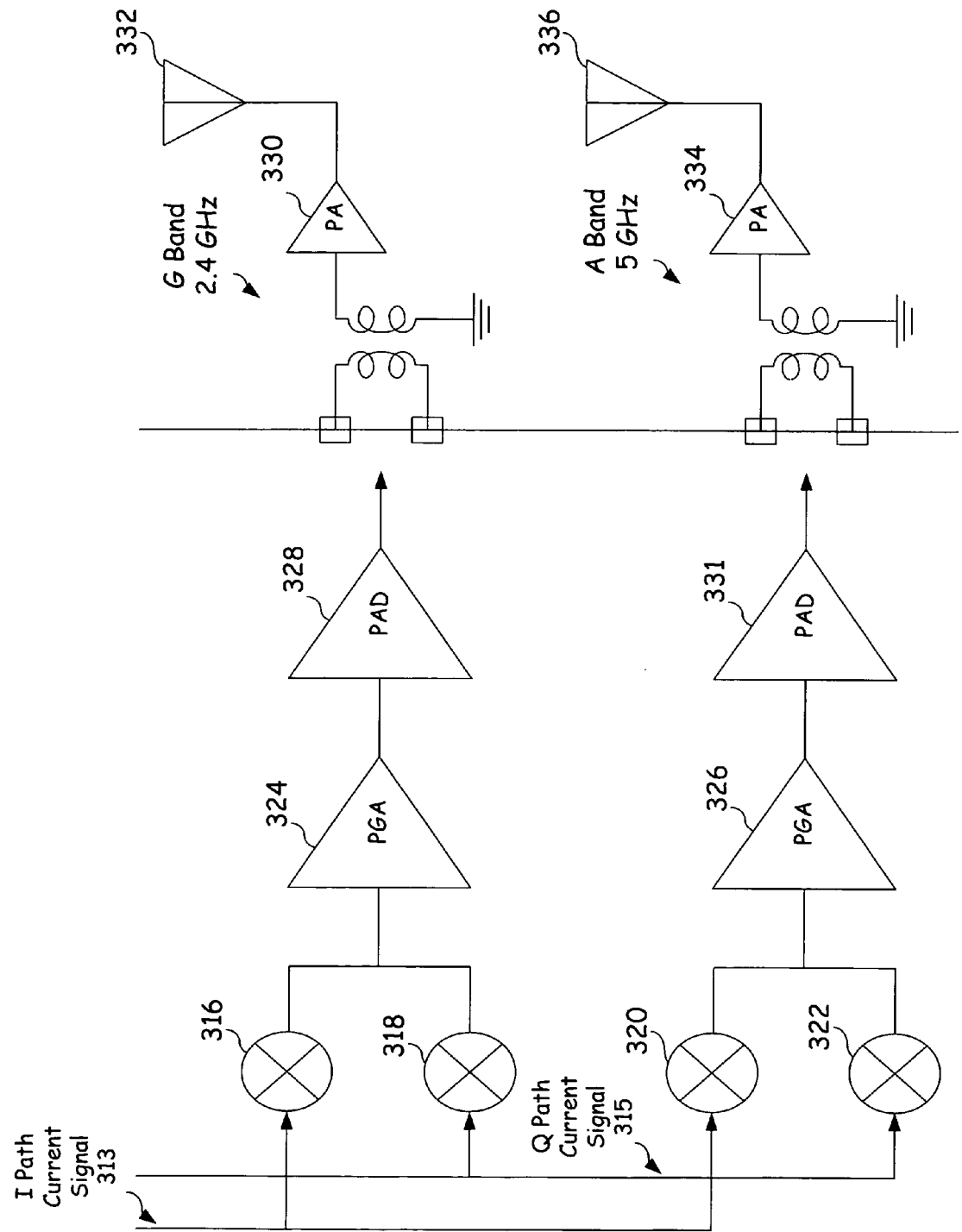
FIG. 4 depicts a circuit to mix, up convert and transmit the baseband signal in accordance with embodiments of the present invention.

The I and Q signals, signals 313 and 315, provided by the GM Stages may be provided to a 802.11.G transmitter or an 802.11.A transmitter depending on the mode of operation. FIG. 4 depicts a circuit to mix, up convert and transmit the baseband signal. When in the 802.11 G mode of operation, the upper pathway of FIG. 4 is used and will be discussed. I signal 313 and Q signal 315 are provided to up conversion mixers 316 and 318. The output signals provided by up conversion mixers 316 and 318 are provided to programmable gain amplifier (PGA) 324. The output of PGA 324 is provided to PA driver 328. This PA driver may be used to drive antenna functions associated with PA 330 used to transmit the RF signal based on the up converted I signal 313 and Q signal 315 via antenna 332 when operating in the G mode.

The lower pathway functions similarly to the G mode of operation, but operates at 5 gigahertz (GHz) versus 2.4 GHz. This lower path includes up conversion mixers 320 and 322 which receive I and Q signals 313 and 314 respectively. The up converted mixed signals are provided to PGA 326. The output of PGA 326 is in turn provided to PA driver 331. This PA driver may be used to drive antenna functions associated with PA 334 used to transmit the RF signal when operating in the A mode using antenna 336.

Figure 5:
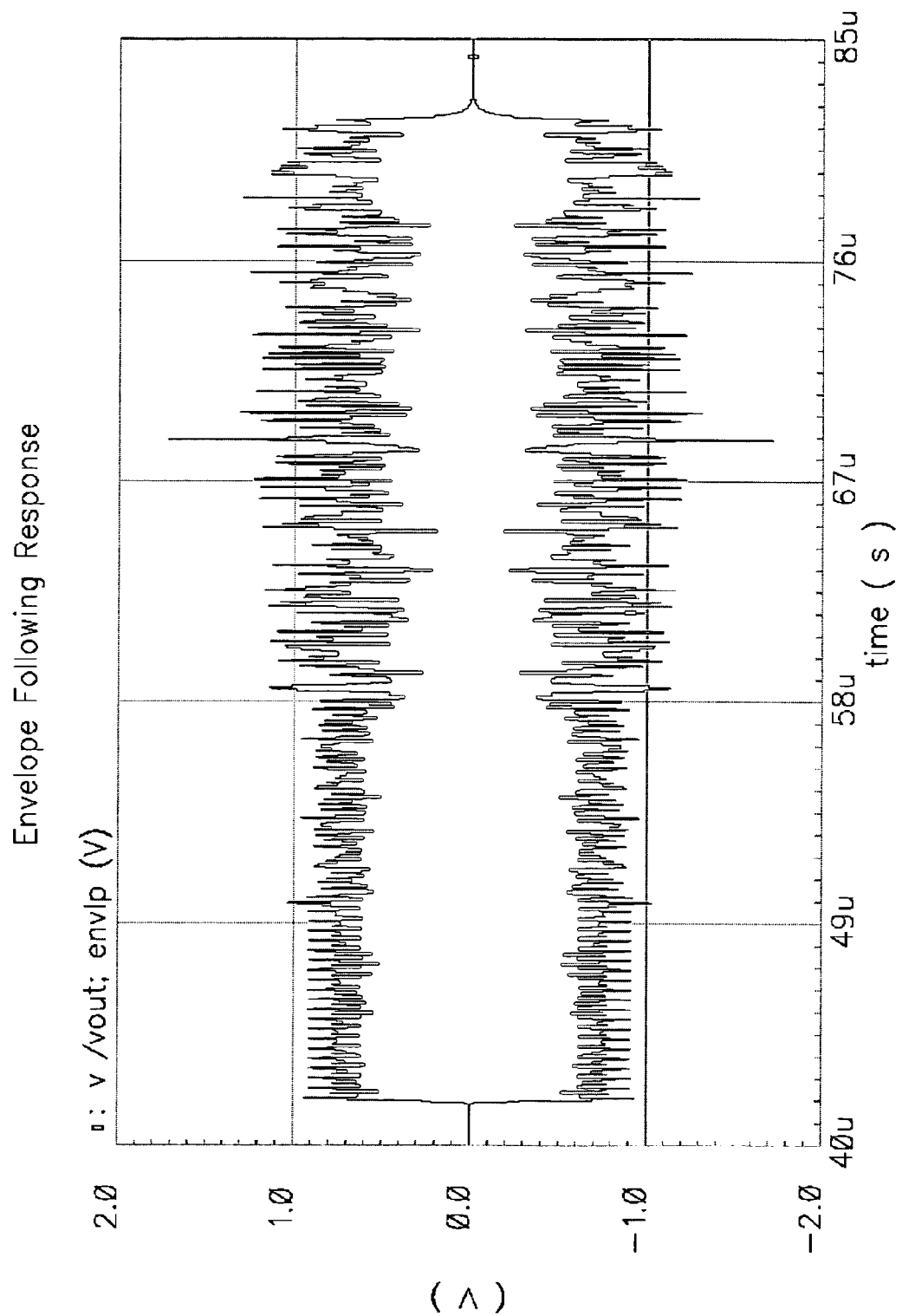
FIG. 5 depicts one of the packet of the amplitude envelope of a typical 802.11 OFDM modulated signal.

PA driver 328 and PA driver 331 in the G band path or the A band path respectively drives an off chip PA used to transmit the signal via antenna 332 when operating in the G band mode or antenna 336 when operating in the A band mode. FIG. 5 depicts one packet of an exemplary amplitude envelope associated with a typical 802.11 A/G modulated signal. This signal exhibits a large peak to average ratio. In this graph, the y-axis plots the upper voltage and the x-axis plots time. As one can observe, the upper voltage may vary greatly and the signal may thus resemble noise.

Figure 6:
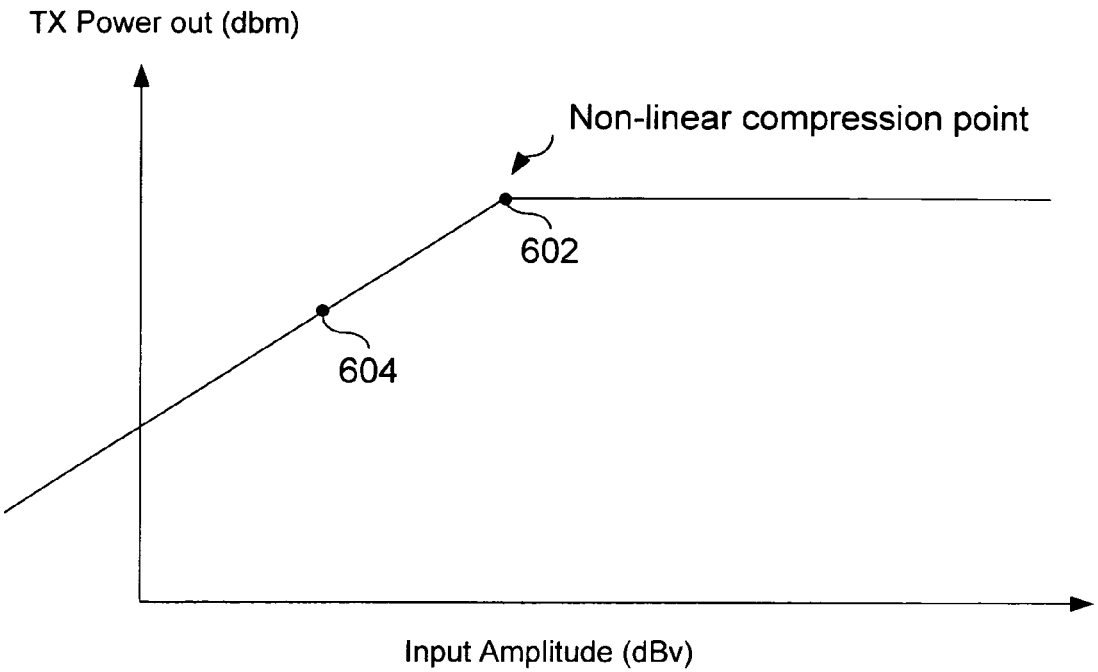
FIG. 6 provides a plot showing the relationship between the input amplitude and the output transmission power.

FIG. 6 provides a plot showing the relationship between the input amplitude and the output transmission power. As one can observe from this plot, a linear relationship exists between the output transmission power and the input amplitude until a non-linear compression point (P1 dB) 602 is reached. Thus, it is desirable to operate at a lower output power (i.e. at point 604) having some distance from the non-linear compression point in order to realize an appropriate error vector match (EVM) and spectrum mask. Since the peak to average ratio may be 10 to 12 dB for an 802.11a/g modulated signal, to avoid distorting the transmitted signal, it is desirable to have the average OFDM output power approximately 10 dB lower than its output 1 dB compression point. For a transmitter with output 1 dB compression point of approximate 15 dBm, the operating point 604 is expected to be approximate 5 dBm to avoid most if not all distortion. Since this system is outputting power of approximately 5 dbm with its linear range (output 1 dB compression) as high as 15 dBm and a high current consumption is associated with this circuit, a low efficiency is realized.

Figure 7:
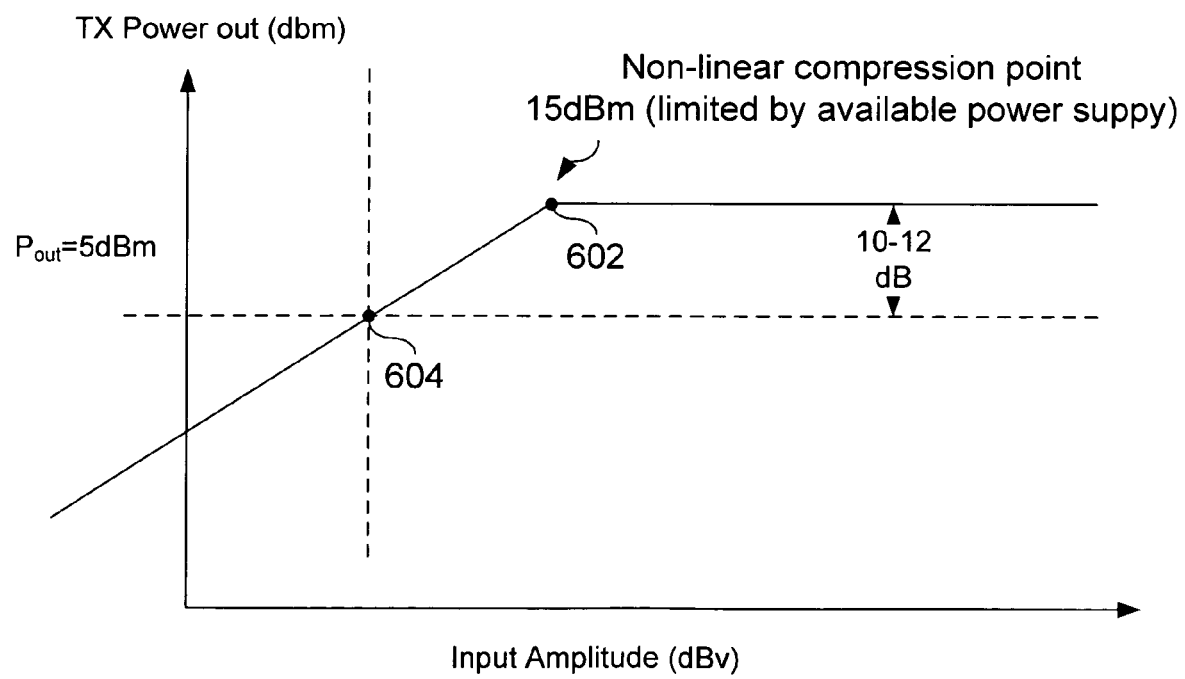
FIG. 7 provides a plot showing the relationship between the input amplitude and the output transmission power and the operating point sits at 10 to 12 dB lower than its output 1 dB compression point.

Embodiments of the present invention substantially address the need to overcome this low efficiency and high current consumption situation when doing power/gain control from the system. FIG. 7 shows the output characteristics of PAD 328 and 331. The output characteristics are linear until the non-linear compression point is reached at approximately 15 dbm. This limit is determined by the available power supply. This limit of 15 dbm is associated with a 3.3 volt architecture PA driver 328/331.

Figure 8:
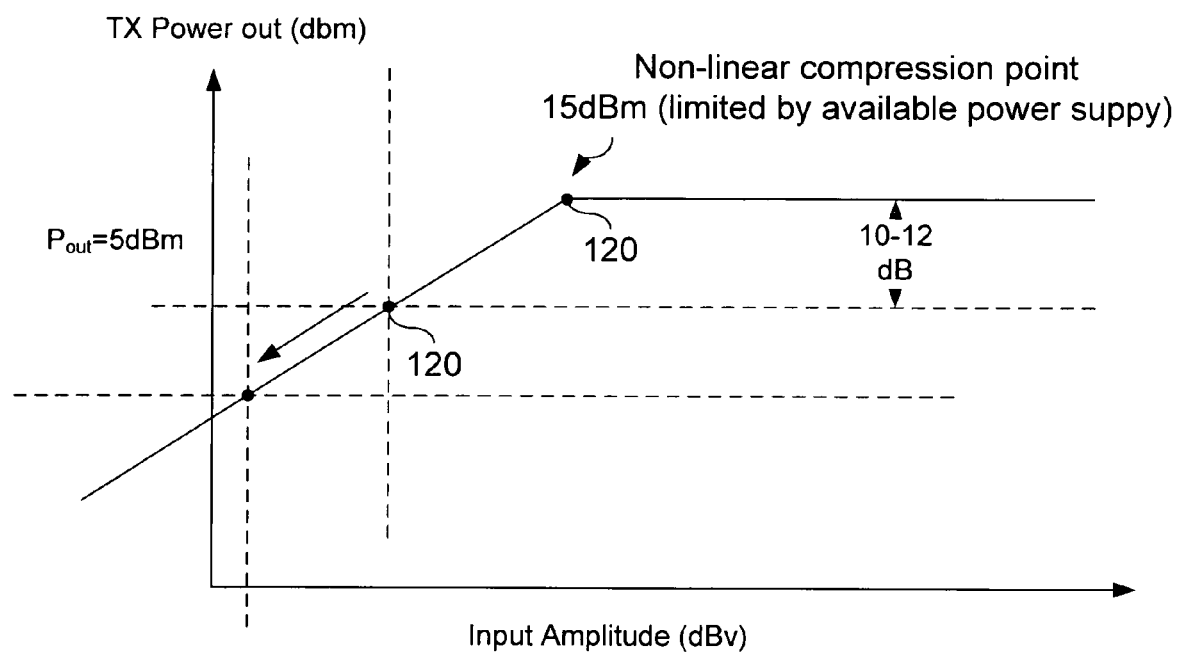
FIG. 8 provides a plot showing the relationship between the input amplitude and the output transmission power as the input amplitude is reduce and the inefficiencies associated with this solution of reducing power consumption.

FIG. 8 depicts one solution when high transmitted power is not required, output transmission power may be driven with a lower input amplitude from PGA 324/326 in order to achieve a lower power output. However reducing the input amplitude reduces the transmitted output power. Current consumption (circuit bias condition) and thus battery power consumption is not reduced. Programmable gain amplifier 324/326 may be driven to produce a lower amplitude signal in order to result in a lower output signal. Reducing this input driving strength reduces the output power but current consumption is not reduced.

Figure 9:
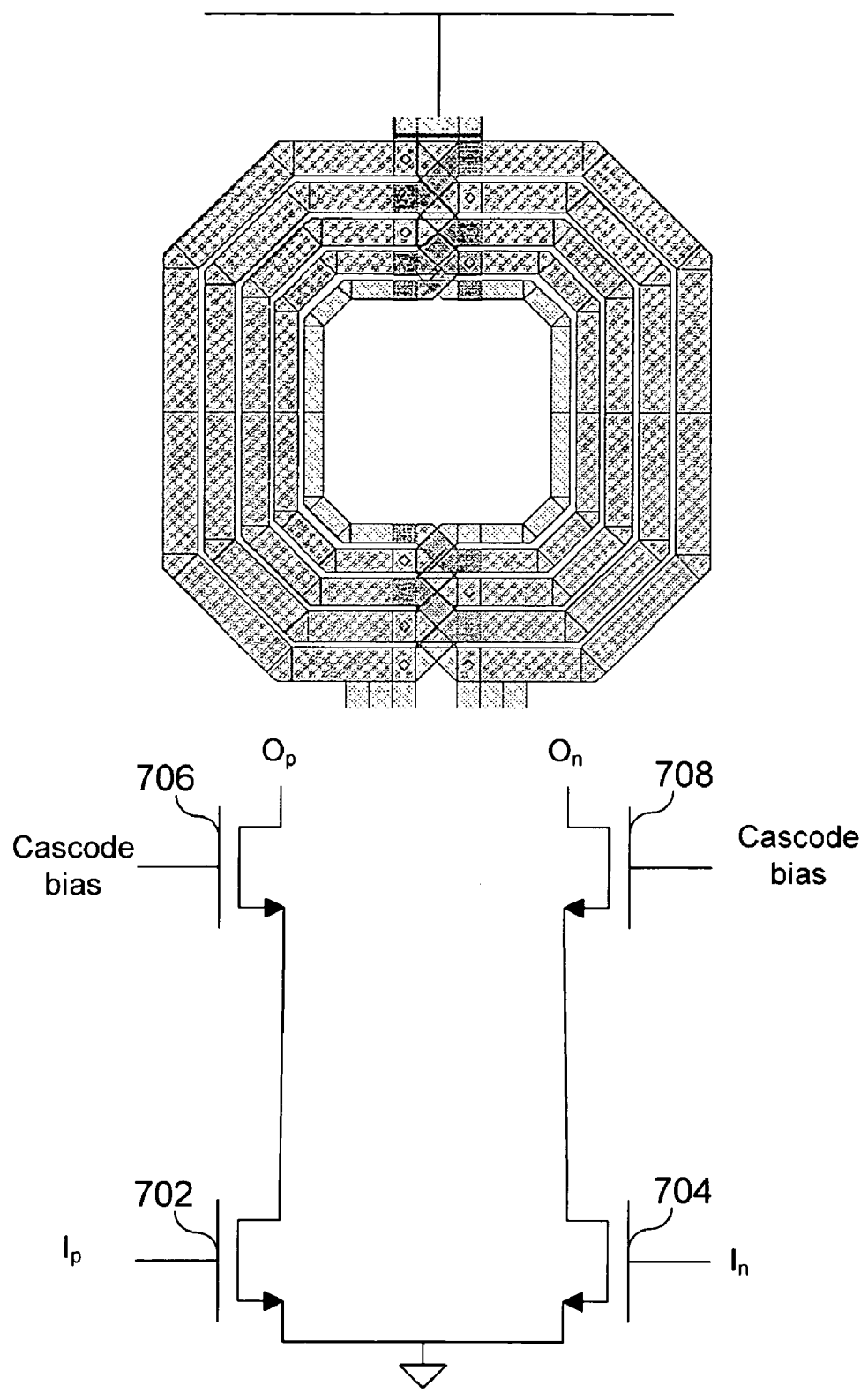
FIG. 9 depicts a PA Driver employing a differential transistor pair and the problem associated with the previous transmitter architectures substantially addressed by embodiments of the present invention.

FIG. 9 depicts the circuit to illustrate the problem where the current consumption is not reduced when doing power/gain control by just lowering its input amplitude. Signals $I_P$ and IN may be provided to a differential pair of transistors 702 and 704. The output of this differential transistor pair is output signal $O_N$ and $O_P$. The bias condition of Transistor 706 and 708 is not adjusted as the amplitude of the driving signal, $I_P$ and $I_N$, is reduced. Therefore, current consumption remains constant. Because the bias current remains unchanged and power consumed from the battery may be described by the equation P=V*I, where the power consumed from the battery remains unchanged while output power is reduced. Embodiments of the present invention allow not only the transmitted output power to be reduced, but the power drawn from the battery to be reduced as well.

Figure 10:
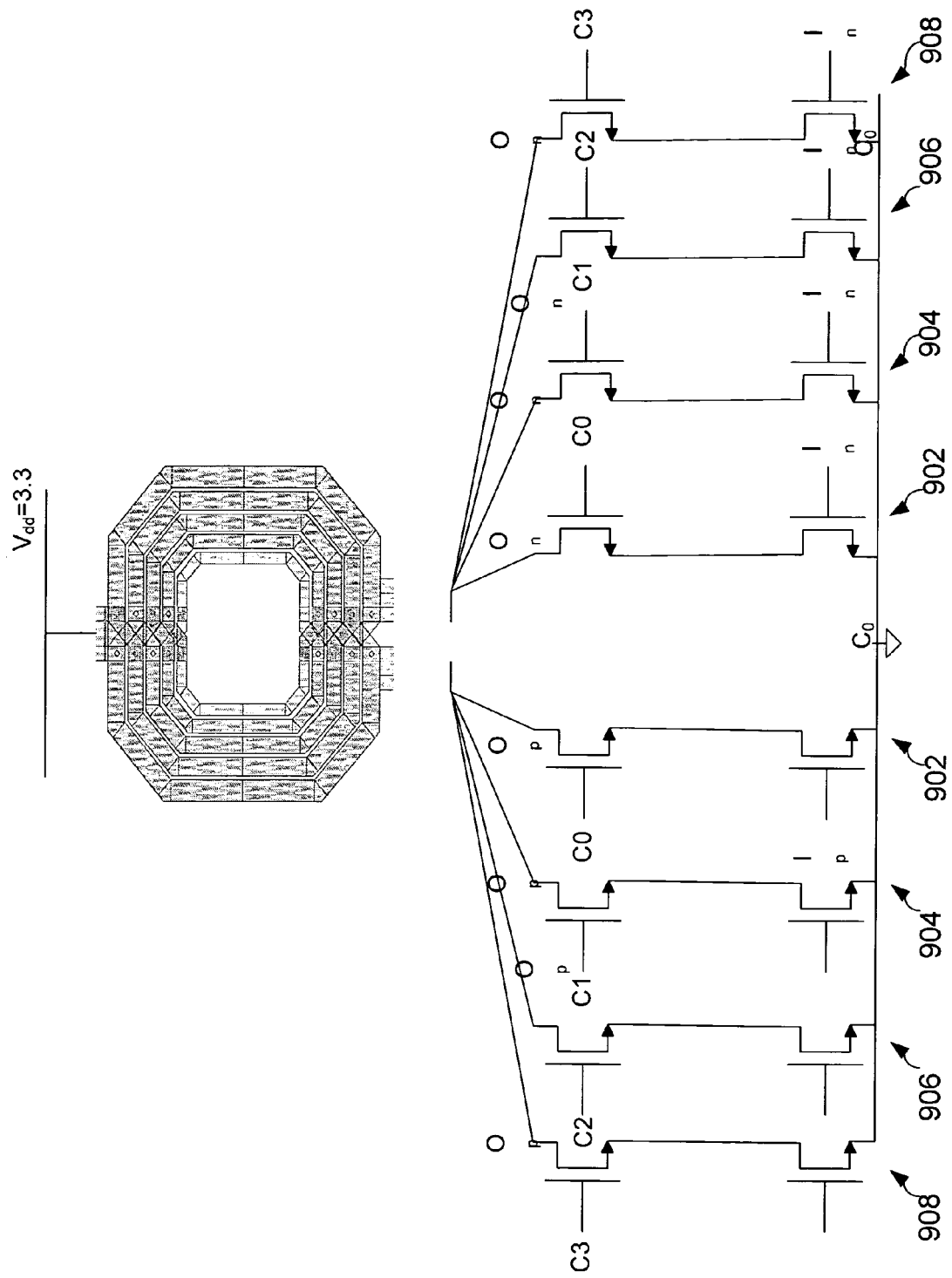
FIG. 10 depicts a PA Driver employing a number of differential transistor pairs in accordance with embodiments of the present invention.

FIG. 10 depicts a number of parallel differential pairs 902, 904, 906, and 908 which may be used within the PA driver. These differential pairs receive an input signal at Ip and In. By dividing the PA driver into a number of selectable differential pairs, the PA driver current may be reduced by only activating necessary differential pairs. Activating each of the differential pair means applying appropriate cascode gate voltage C0, C1, C2 and C3 to turn on the cascode device and hence the differential pair. Not activating each of the differential pair means applying appropriate cascode gate voltage, 0 for example, of C0, C1, C2 and C3 to turn off the cascode device and hence the differential pair. This reduces the battery power consumption by keeping the supply voltage the same, while reducing the bias current when doing power/gain control.

Figure 11:
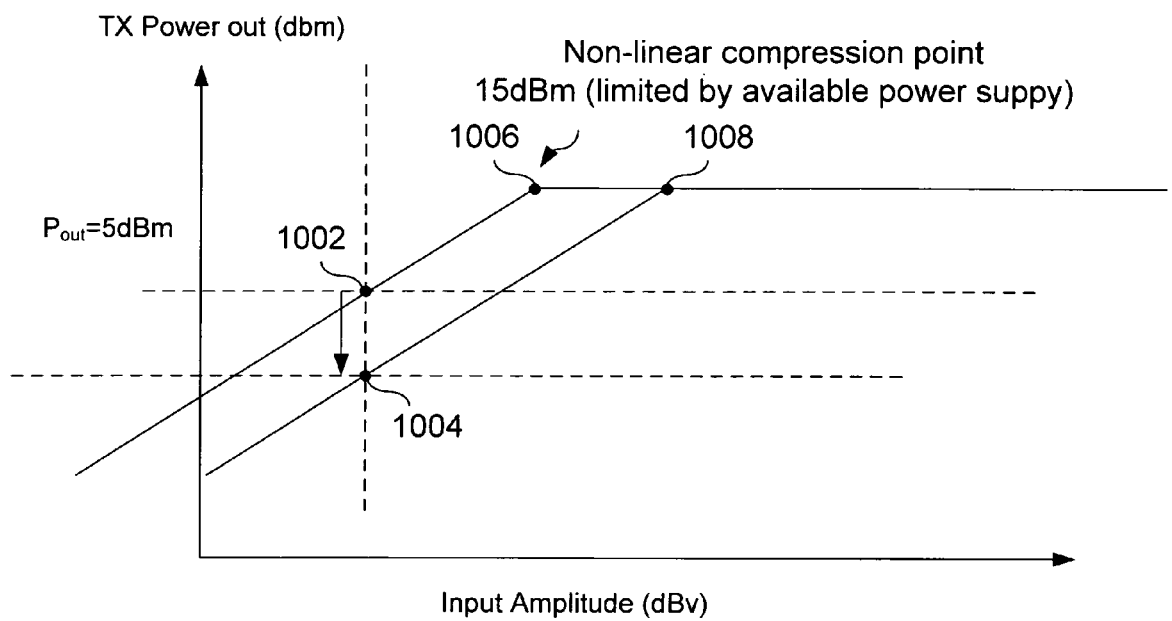
FIG. 11 provides a plot showing the relationship between the input amplitude and the output transmission power as the individual differential pair cascode bias of the PA driver is controlled in accordance with embodiments of the present invention.

FIG. 11 provides a graph of how transmitted power and battery consumption may be further reduced in accordance with embodiments of the present invention. Unlike prior embodiments which prior solutions which merely reduced the input amplitude and in so doing reduced the transmitted power but failed to decrease the power drained from the battery, embodiments of the present invention do not necessarily have to reduce the input amplitude but instead, by turning off various branches or differential pairs of the PA driver of FIG. 10, the operating curve of the is shifted downward as opposed to the left. Therefore the operating point 1002 is shifted downward to operating point 1004. This shift results in a reduction in the transmitted power and a further distances the new operating Point 1004 from the nonlinear compression Points 1008. Thus, the amplitude of the output of the PGA 324 and 326 may be maintained constant. By disabling differential branches within the PAD, bias current is reduced and in so doing, power drain or consumption from the battery is reduced.

Figure 12:
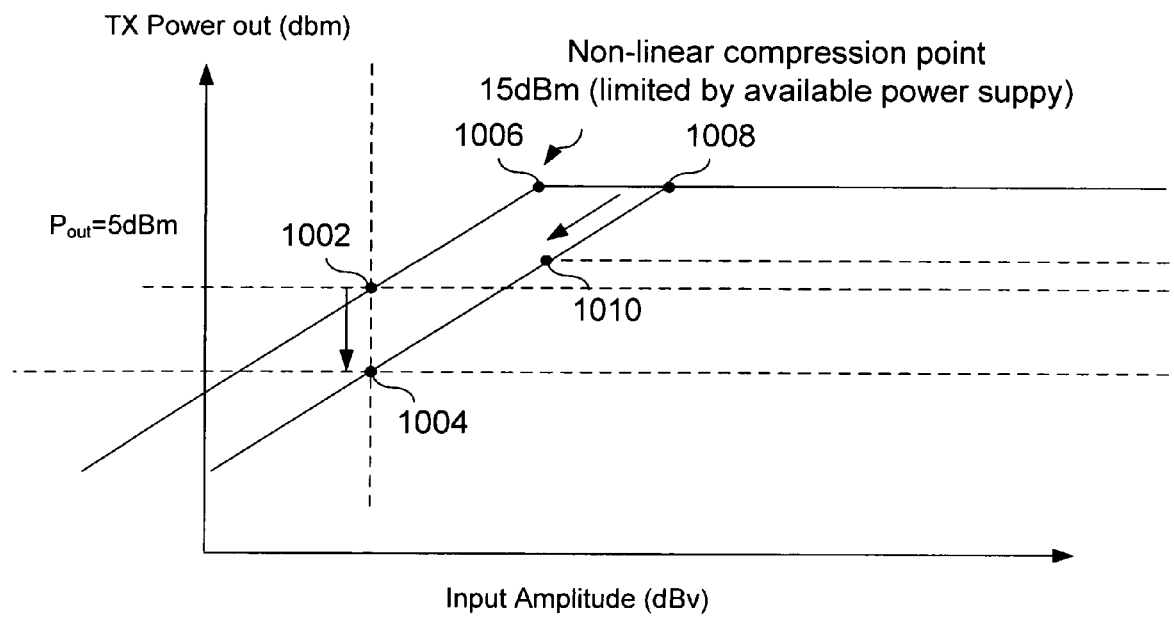
FIG. 12 provides a plot showing the relationship between the input amplitude and the output transmission power as the individual differential pair cascode bias of the PA driver is controlled in accordance with embodiments of the present invention. Power supply voltage for PA driver is reduced accordingly for further reduction of power consumed from supply in accordance with embodiments of the present invention.

As shown in FIGS. 11 and 12, the operating point 1004 is now more than 10 DB from the nonlinear compression point, P1 dBm. This means that the circuit is over designed and power is wasted. As previously shown, the nonlinear compression point is limited by the available power $V_{dd}$. By reducing VDD as shown in FIG. 12, the nonlinear compression point may be pushed lower when high linearity is not required. Thus, this allows additional power from the battery to be saved by reducing both current (cascode bias current) and voltage ($V_{dd}$).

Figure 13:
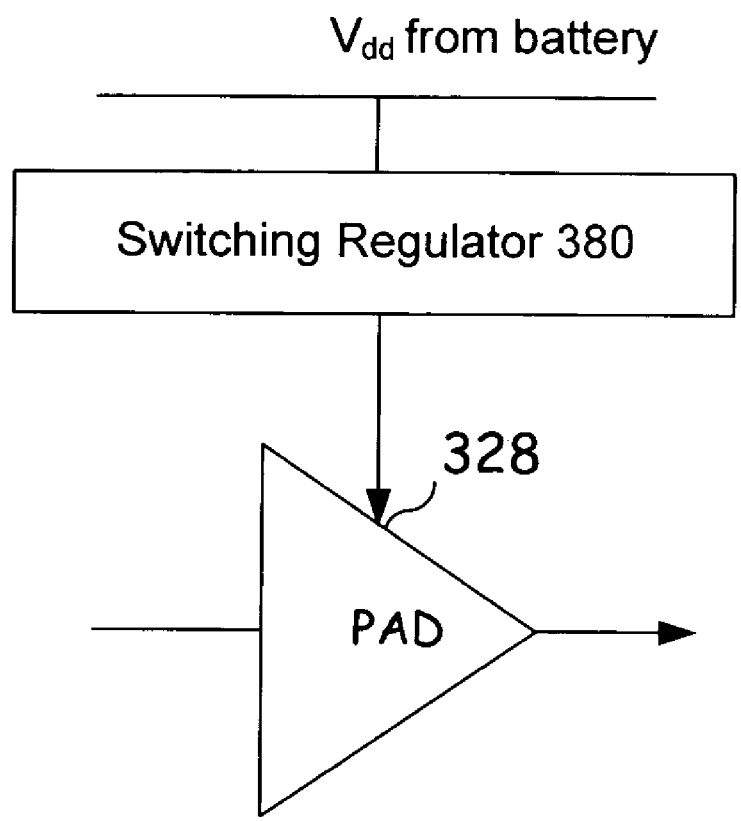
FIG. 13 depicts a PA driver having a programmable voltage to reduce power consumption in accordance with embodiments of the present invention.

FIG. 13 depicts a switching regulator coupled to the PAD of the prior FIGs. to implement this reduction. As shown in FIG. 13, it is possible to reduce the output power as described previously with reference to the as described above. One of the ways in which VDD may be ingested for PAD 328 and 331 is through a switching regulator 380 that steps the main VDD voltage down. Thus, gain control on the PAD may be used to first reduce the current drain and thus reduce power. Using the regulator will result in a further reduction by lowering the nonlinear compression point. Thus, power is reduced. And the efficiency of the power utilized by the PAD compared to the power absorbed from the battery is increased by using the switching Regulator 380. Thus, battery power overall is conserved.

Figure 14:
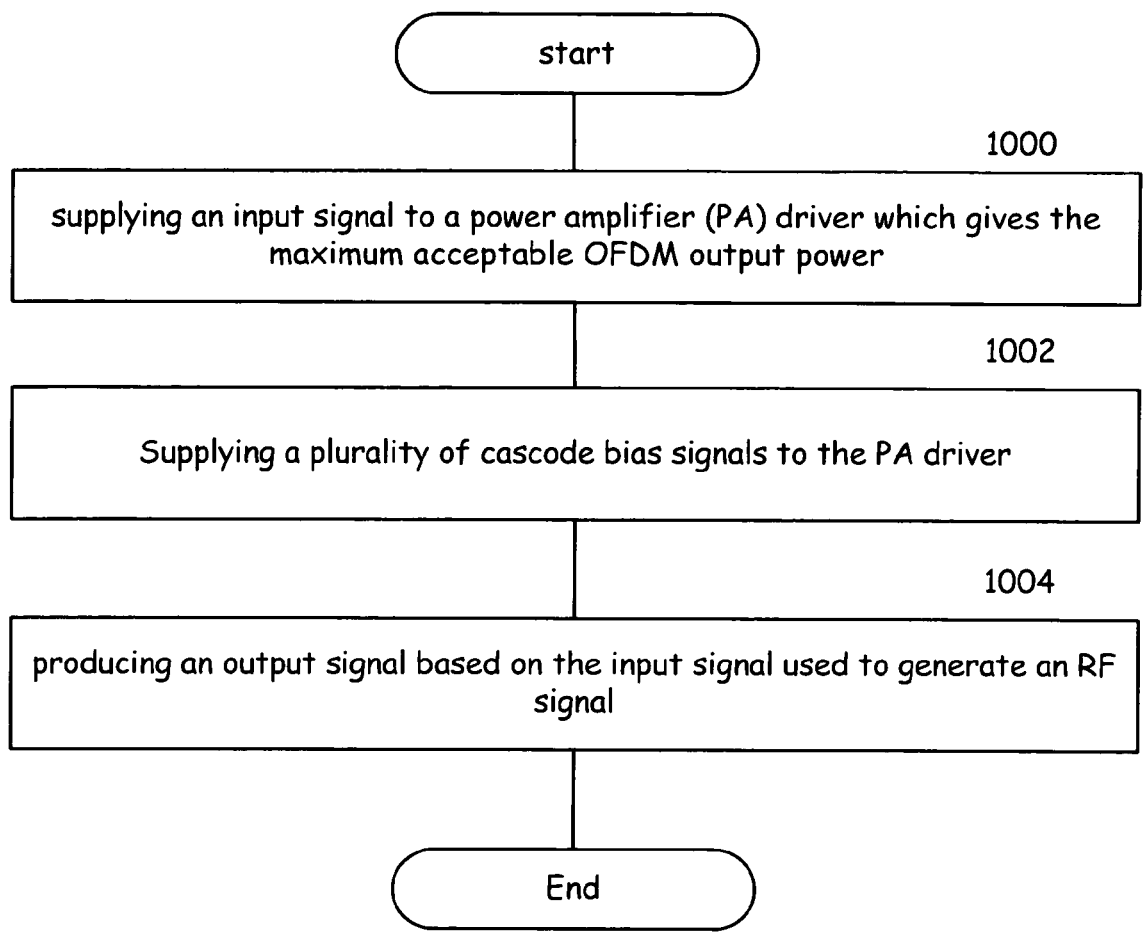
FIG. 14 provides a logic flow diagram that provides a method to reduce power consumption in accordance with embodiments of the present invention.

FIG. 14 provides a logic flow diagram in accordance with embodiments of the present invention wherein the transmitted output power and the battery consumption of a wireless device may be reduced when doing transmitter power/gain control. This involves supplying an input signal in Step 1000 to a power amplifier (PAD) driver which gives the maximum acceptable OFDM average power. This input signal may be an up converted baseband analog signal. This signal may use a pair of differential analog signals and may have an I and Q component. In Step 1002 a plurality of cascode bias signals are provided to the PA driver. PA driver uses a plurality of differential pairs to produce an output signal used to generate an RF signal in Step 1004. The cascode bias signals of Step 1002 may be selected to enable or disable individual differential transistor pairs within the PA driver. By disabling individual differential transistor pairs within the PA driver, the cascode bias current supplied to the PA driver's differential transistor pairs may be reduced. Reducing the activated differential pairs allows both transmitted output power and the battery consumption of the wireless device to be reduced.

Figure 15:
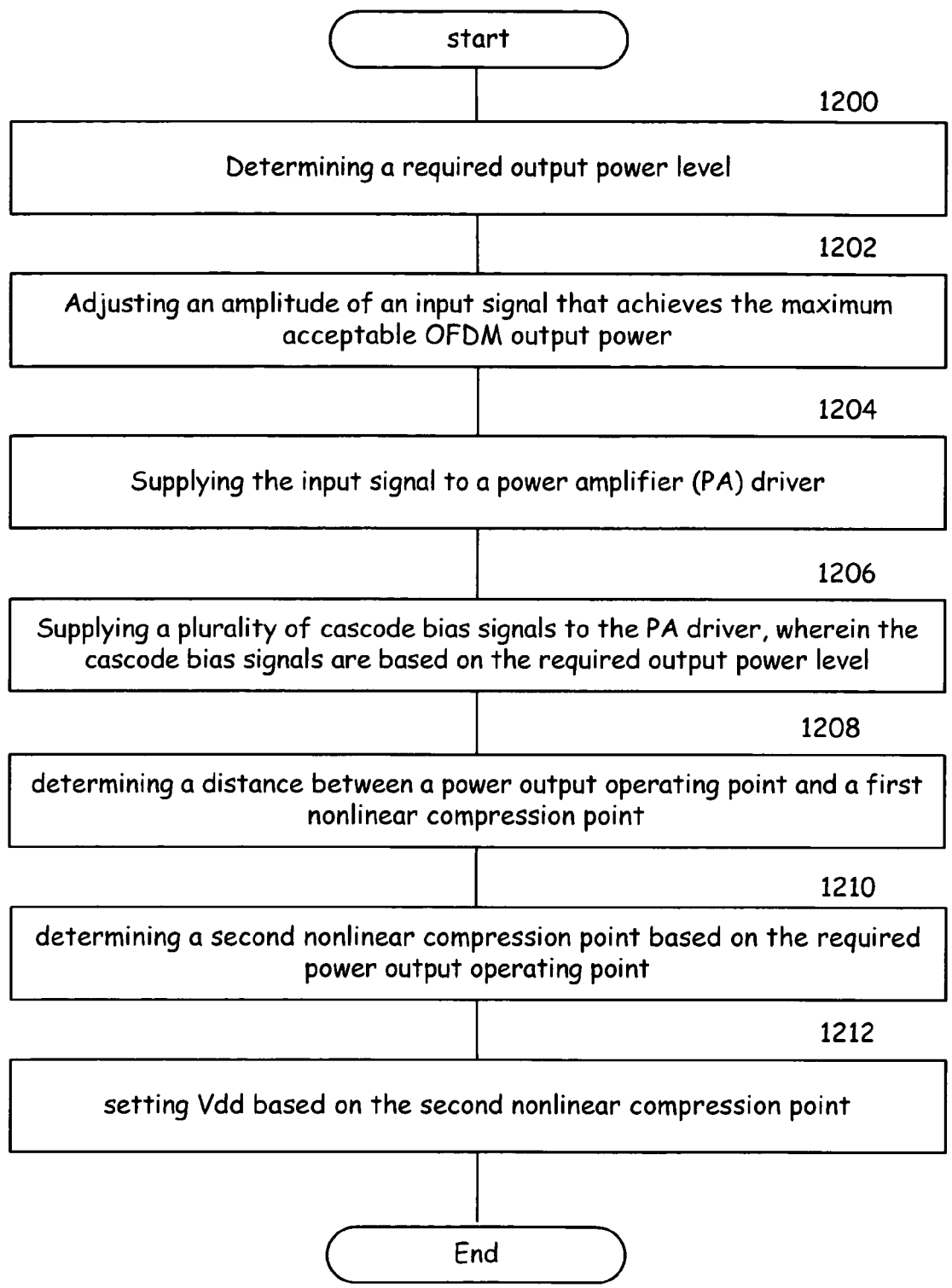
FIG. 15 provides a second logic flow diagram that provides a method to reduce power consumption in accordance with embodiments of the present invention.

FIG. 15 provides a method to reduce transmitted output power and the battery consumption in accordance with an embodiment of the present invention. This involves first determining the required output level at Step 1200. The amplitude of the input signal provided to the PA driver may be based on achieving the maximum acceptable OFDM average power. This amplitude may be set by a PGA as previously discussed such that the PGA may determine and set the amplitude of the input signal provided to the PA driver. In Step 1204 the input signal is provided to the PA driver. In Step 1206 a number of cascode bias signals are also provided to the PA driver. These cascode bias signals are based on the required output power level. As discussed with reference to FIGS. 9 through 14 cascode device gate biases are applied to activate necessary differential pairs to allow power consumption of the wireless device to be reduced.

In Step 1208 a distance between the power operating point of the wireless device and a first non-linear compression point is determined. If this distance exceeds a predetermined threshold such as 10 to 12 db, it is desirable to determine a second non-linear compression point in Step 1210 based on the required power output. This allows, in Step 1212, the voltage supplied to the PA driver to be reduced in order to realize the second non-linear compression point. Reducing the voltage substantially based on the required power output again allows the power consumption and battery consumption of the wireless device to be reduced.

The above described calculations and processes may be executed within the baseband processor or a processing module. The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module 32 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. The memory stores, and the processing module executes, operational instructions corresponding to at least some of the steps and/or functions illustrated in FIGS. 13 and 14.

In summary, embodiments of the present invention provide a method to reduce transmitted output power and the battery consumption when doing transmitter power/gain control. This involves first determining the required output level. The amplitude of the input signal provided to a PA driver is set by achieving the maximum acceptable OFDM average power. This amplitude may be set by a PGA. A number of cascode bias signals are also provided to the PA driver. These cascode bias signals are based on the required output power level as well. Applying the cascode gate bias signal to enable/disable differential pair circuits within the PA driver allows power consumption of the wireless device to be reduced when doing power/gain control.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents. Further, it should be understood that various changes, substitutions and alterations can be made hereto without departing from the spirit and scope of the invention as described by the appended claims.

What is claimed is:

1. A method to reduce power consumption within a wireless device comprising:

supplying an input signal to a power amplifier (PA) driver;

supplying a plurality of cascode bias settings to the PA driver, wherein the cascode bias settings are operable to enable and disable differential transistor pairs within the PA driver;

determining a distance between a first operating point for the PA driver to amplify the input signal and a first nonlinear compression level;

selecting bias settings to selectively enable and disable differential transistor pairs to operate at a second operating point for the PA driver which is more distant from the first nonlinear compression level than the first operating point;

determining a second nonlinear compression level which is lower in magnitude than the first nonlinear compression level;

setting a supply voltage to operate the PA driver at the second nonlinear compression level; and producing an output signal from the PA driver using the second operating point and the second nonlinear compression level for the PA driver.

2. The method of claim 1, wherein a switching regulator is operable to reduce the supply voltage supplied to the PA driver.

3. The method of claim 1, wherein the input signal is an up converted differential analog signal.

4. The method of claim 1, wherein the output signal is used to generate an RF signal that is compliant with an 802.11 communication standard.

5. The method of claim 1, wherein the input signal is coupled from a programmable gain amplifier (PGA), wherein the PGA sets an amplitude for the input signal based on a required output power level.

6. A wireless terminal that comprises:
  a baseband processor operable to output a baseband digital signal;
  an analog circuit operable to convert the baseband digital signal to a baseband analog signal and up convert the baseband analog signal;
  a programmable gain amplifier (PGA) operable to receive the up converted baseband signal and to adjust gain of the upconverted baseband analog signal;
  a power amplifier (PA) driver coupled to receive an output signal of the PGA, the PA driver including a plurality of differential transistor pairs, wherein individual transistor pairs are enabled and disabled based on a selected transmit output power level, in which PA driver operation is set by determining a distance between a first operating point for the PA driver to amplify the signal coupled from the PGA and a first nonlinear compression level, selecting bias settings to selectively enable and disable differential transistor pairs to operate at a second operating point for the PA driver which is more distant from the first nonlinear compression level than the first operating point, determining a second nonlinear compression level which is lower in magnitude than the first nonlinear compression level and setting a supply voltage to operate the PA driver at the second nonlinear compression level and wherein the PA driver produces an output drive signal to generate an RF signal for transmission by using the second operating point and the second nonlinear compression level for the PA driver for reduced power consumption.

7. The wireless terminal of claim 6, wherein the wireless terminal is operable to determine a required transmit power level and selects the transmit output power level based on the required transmit power level.

8. The wireless terminal of claim 6, wherein the output drive signal from the PA driver is used to generate an RF signal that is compliant with an 802.11 communication standard.

* * * * *